(12) United States Patent
Missey et al.

(10) Patent No.: US 6,754,243 B2
(45) Date of Patent: Jun. 22, 2004

(54) TUNABLE DISTRIBUTED FEEDBACK LASER

(75) Inventors: Mark Missey, Santa Clara, CA (US); Bardia Pezeshki, Redwood City, CA (US); Robert J. Lang, Pleasanton, CA (US)

(73) Assignee: JDS Uniphase Corporation, San Jose, CA (US)

( * ) Notice: Subject to any disclaimer, the term of this patent is extended or adjusted under 35 U.S.C. 154(b) by 256 days.

(21) Appl. No.: 09/925,963

(22) Filed: Aug. 9, 2001

(65) Prior Publication Data

US 2002/0064192 A1 May 30, 2002

Related U.S. Application Data

(60) Provisional application No. 60/224,385, filed on Aug. 9, 2000, and provisional application No. 60/244,696, filed on Oct. 30, 2000.

(51) Int. Cl.[7] .............................. H01S 3/10; H01S 5/00; H01S 3/08
(52) U.S. Cl. .............................. 372/20; 372/23; 372/50; 372/96
(58) Field of Search ........................... 372/50, 102, 23, 372/92, 20, 96; 359/291

(56) References Cited

U.S. PATENT DOCUMENTS

| | | | |
|---|---|---|---|
| 4,317,611 A | 3/1982 | Petersen | 359/214 |
| 4,498,730 A | 2/1985 | Tanaka et al. | 385/18 |
| 5,291,502 A | 3/1994 | Pezeshki et al. | 372/20 |
| 5,378,330 A | 1/1995 | Li et al. | 205/661 |
| 5,379,310 A | 1/1995 | Papen et al. | 372/23 |
| 5,379,318 A | 1/1995 | Weber | 372/96 |
| 5,420,416 A | 5/1995 | Iida et al. | 250/201.1 |

(List continued on next page.)

FOREIGN PATENT DOCUMENTS

FR   2805092   8/2001   ............. H01S/3/23

OTHER PUBLICATIONS

Buus, "Broadband Lightwave Sources and System", http://www.infowin.org/ACTS/RUS/PROJECTS/ac065.htm, Oct. 17, 2000 (4 pgs).

Daneman, et al., "Laser–to–Fiber Coupling Module Using a Micromachined Alignment Mirror", IEEE Photonics Technology Letters, vol. 8, No. 3, Mar. 1996 (pp. 396–398).

Dellunde, "Laser diodes", http://www.geocities.com/jdellund/receng.htm, Aug. 8, 2001 (4 pgs).

Gordon, "Hybrid Mode–Locked DBR–laser", http://www.ece.ucsb.edu/MOST/33.html Jan. 22, 1996 (2 pgs).

Howe, "Light fantastic", http://digitalmass.boston.com/news/daily/05/22/light_fantastic.html, May 22, 2000, (5 pgs).

Hunter, et al., "Guided wave optical switch architectures. Part 1. Space switching", International Journal of Optoelectronics, vol. 9, No. 6, Nov. 1, 1994 (pp. 477–487).

(List continued on next page.)

Primary Examiner—Quyen Leung
(74) Attorney, Agent, or Firm—Allen, Dyer, Doppelt, Milbrath & Gilchrist, P.A.

(57) ABSTRACT

A wavelength tunable laser includes a distributed feedback (DFB) array with first and second DFB laser diodes that generate first and second beams of light in first and second wavelength ranges. A microelectromechanical (MEMS) optical element selectively couples one of the first and second beams of light from the DFB laser array into an optical waveguide. The MEMS optical element includes a collimating lens and a thermal or electrostatic MEMS actuator for moving the collimating lens to select the one of the first and second beams of light. A focusing lens is located between the collimating lens and the optical waveguide. Alternately, the MEMS optical element includes a fixed collimating lens that collimates the first and second beams of light, a mirror, and a MEMS actuator for tilting the mirror to select the one of the first and second beams of light.

102 Claims, 10 Drawing Sheets

U.S. PATENT DOCUMENTS

| | | | | |
|---|---|---|---|---|
| 5,468,975 | A | 11/1995 | Valster | 257/97 |
| 5,524,076 | A | 6/1996 | Rolland et al. | 385/8 |
| 5,550,850 | A | 8/1996 | Lee et al. | 372/16 |
| 5,612,968 | A | 3/1997 | Zah | 372/50 |
| 5,771,253 | A | 6/1998 | Chang-Hasnain et al. | 372/20 |
| 5,777,763 | A | 7/1998 | Tomlinson, III | 359/130 |
| 5,798,859 | A | 8/1998 | Colbourne et al. | 359/247 |
| 5,825,792 | A | 10/1998 | Villeneuve et al. | 372/32 |
| 5,828,689 | A | 10/1998 | Epworth | 372/98 |
| 5,838,714 | A | 11/1998 | Delorme | 372/96 |
| 5,870,417 | A | 2/1999 | Verdiell et al. | 372/32 |
| 5,882,468 | A | 3/1999 | Crockett et al. | 156/345.3 |
| 5,930,045 | A | 7/1999 | Shirasaki | 359/577 |
| 5,953,359 | A | 9/1999 | Yamaguchi et al. | 372/50 |
| 5,978,402 | A | 11/1999 | Matsumoto et al. | 372/50 |
| 5,999,303 | A | 12/1999 | Drake | 359/224 |
| 6,075,650 | A | 6/2000 | Morris et al. | 359/641 |
| 6,078,394 | A | 6/2000 | Wood | 356/352 |
| 6,091,537 | A | 7/2000 | Sun et al. | 359/248 |
| 6,133,615 | A | 10/2000 | Guckel et al. | 257/446 |
| 6,141,370 | A | 10/2000 | Avrutsky et al. | 372/102 |
| 6,150,667 | A | 11/2000 | Ishizaka et al. | 257/21 |
| 6,154,588 | A | 11/2000 | Kai | 385/27 |
| 6,167,075 | A | 12/2000 | Craig et al. | 372/75 |
| 6,191,897 | B1 | 2/2001 | Blake et al. | 359/814 |
| 6,201,629 | B1 | 3/2001 | McClelland et al. | 359/223 |
| 6,212,151 | B1 | 4/2001 | Heanue et al. | 369/112 |
| 6,256,328 | B1 | 7/2001 | Delfyett et al. | 372/23 |
| 6,272,271 | B1 | 8/2001 | Wojnarowski et al. | 385/52 |
| 6,275,315 | B1 | 8/2001 | Park et al. | 359/153 |
| 6,411,424 | B1 * | 6/2002 | Raj | 359/291 |
| 2001/0017876 | A1 | 8/2001 | Kner et al. | 372/50 |
| 2001/0021053 | A1 | 9/2001 | Colbourne et al. | 359/161 |
| 2001/0036206 | A1 | 11/2001 | Jerman et al. | 372/20 |
| 2001/0046077 | A1 | 11/2001 | Akiyama et al. | 359/161 |
| 2001/0050928 | A1 | 12/2001 | Cayrefourcq et al. | 372/12 |

OTHER PUBLICATIONS

Hunwicks, "Advancing the Optical Component", http://www.telecoms-mag.com/issues/200004/tci/advancing.html, Apr. 2000, (6 pgs).

Jacques, "Phase conjugate mirror and diffraction grating yield stable, collimated, coherent, high-power diode laser", http://omlc.ogi,edu/news/dec97/pclaser.html, Oregon Medical Laser Center Newsletter, Dec. 1997 (2 pgs).

Kopka, et al., "Bistable 2x2 and Multistable 1x4 Micromechanical Fibre-optic Switches on Silicon", Micro Opto Electro Mechanical Systems—MOEMS '99 (pp. 88–91).

Kudo, et al., "Multiwavelength microarray semiconductor lasers", Electronics Letters, vol. 34, No. 21, Oct. $15^{th}$, 1998, (pp. 2037–2038).

Li, et al., "16-Wavelength Gain-Coupled DFB Laser Array with Fine Tunability", IEEE Photonics Technology Letters, vol., 8, No. 1, Jan. 1996 (pp 22–24).

Liu, et al., "Cost-effective wavelength selectable light source using DFB fibre laser array", Electronics Letters, vol. 36, No. 7, Mar. 30, 2000 (p. 620).

Marconi Communications, Telecom '99, Geneva, "(BW) (OH-MARCOMI-COMM-2) Marconi Communications Announces World-Beating Commercial Tuneable Laser at Telecom '99", http://www.businesswire.com/cgi-bin/ts_headline.sh?/bw.101199/192842212, Oct. 11, 1999, (2 pgs).

Maluf, "The New Gearbox: A Peek Into the Future", An Introduction to Microelectromechanical Systems Engineering, Artech House (2000) (pp. 187–190), no month.

OPTO+, "Tunable Distributed Bragg Reflector Laser: A Simple Solution for WDM Spare Boards, Regular Boards and Protection", 1999 (2 pgs).

Pezeshki, et al., "12nm tunable WDM source using an integrated laser array", Electronics Letters, vol. 36, No. 9, Apr. 27, 2000 (pp. 788–789).

Shirasaki, "Chromatic-Dispersion Compensator Using Virtually Imaged Phased Array", IEEE Photonics Technology Letters, vol. 9, No. 12, Dec. 1997 (pp. 1598–1600).

Silverman, "VCs beam big bucks at optics upstarts", http://www.redherring.com/vc/2000/1009/vc-optics100900.html?id-yahoo, Oct. 9, 2000 (6 pgs).

Solgaard, et al., "Optoelectronic Packaging Using Silicon Surface-Micromachined Alignment Mirrors", IEEE Photonics Technology Letters, vol. 7, No. 1, Jan. 1995 (pp. 41–43).

Wu, "Micromachining for Optical and Optoelectronics Systems", Proceedings of the IEEE, vol. 85, No. 11, Nov. 1997 (pp. 1833, 1843–1852).

* cited by examiner

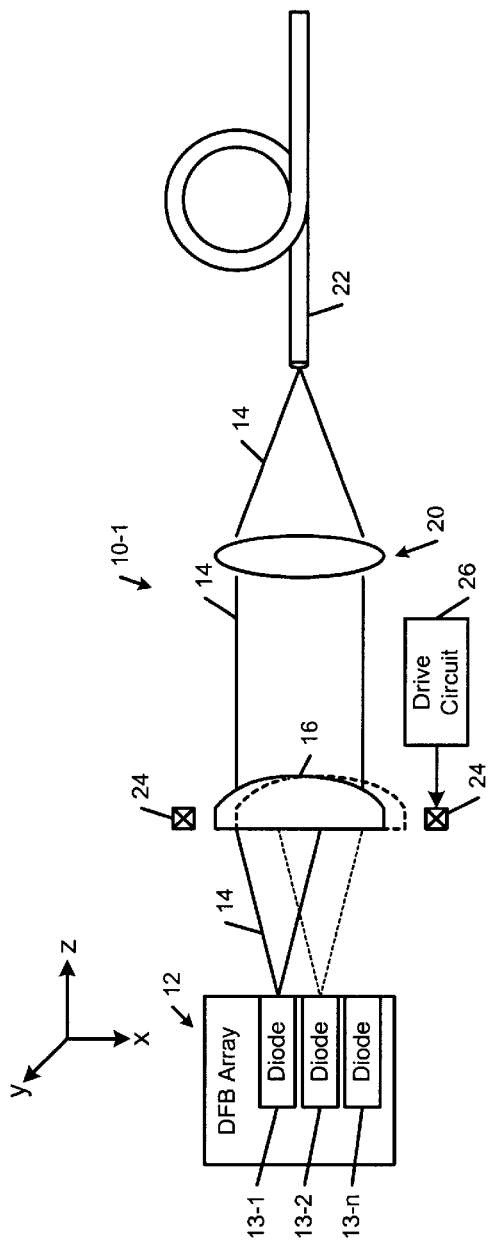
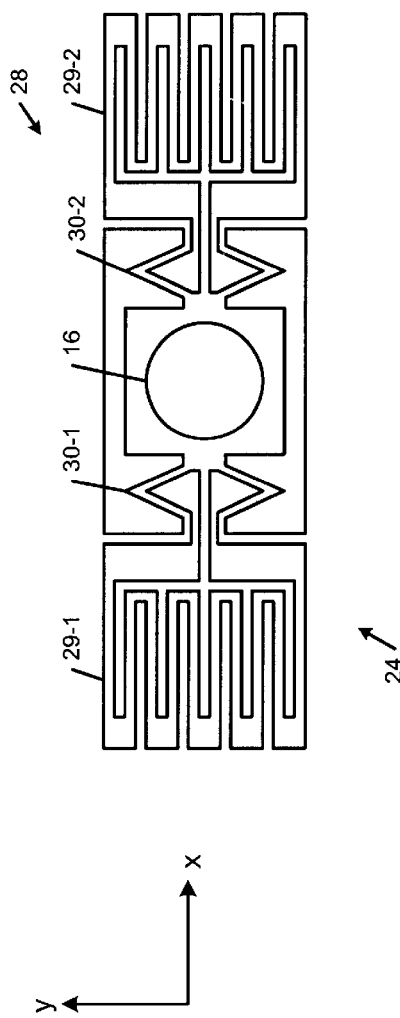
Fig. 1
Fig. 2A

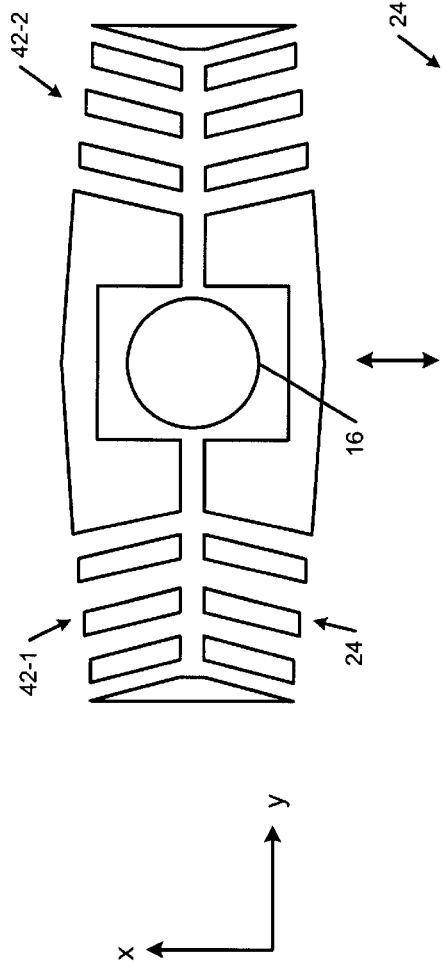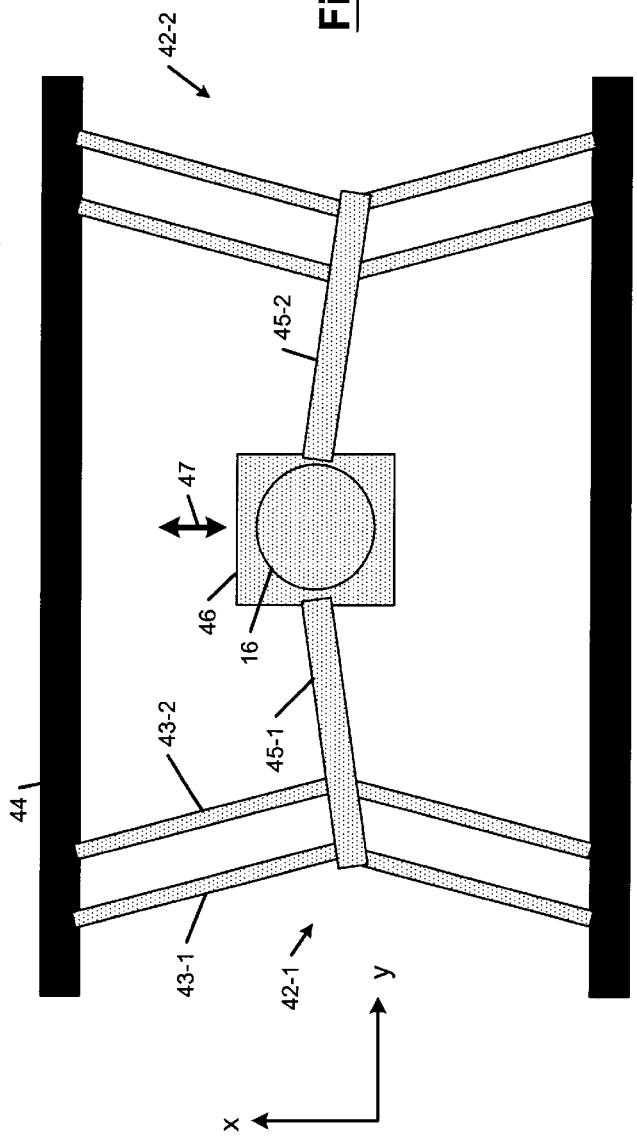

TUNABLE DISTRIBUTED FEEDBACK LASER

CROSS-REFERENCE TO RELATED APPLICATIONS

This application claims the benefits of U.S. Provisional Application No. 60/224,384, filed Aug. 9, 2000 and U.S. Provisional Application No. 60/244,696, filed Oct. 30, 2000.

FIELD OF THE INVENTION

The present invention relates to distributed feedback (DFB) lasers, and more particularly to tunable DFB lasers.

BACKGROUND OF THE INVENTION

Distributed feedback (DFB) laser arrays with multiple DFB laser diodes are coupled through a multimode interference coupler to provide a single output. The DFB laser array is temperature tuned to adjust the wavelength that is output by the DFB laser diodes. For example, if each DFB laser diode provides 3 nanometers (nm) of temperature tuning, a DFB laser array with four DFB diode lasers covers 12 nm, which is equivalent to sixteen 100 Giga Hertz (GHz) channels.

Using DFB laser arrays has some advantages over alternatives such as tunable vertical cavity surface emitting laser (VCSELs), grating assisted codirectional coupler with sampled rear reflector (GCSR) lasers, and/or tunable distributed Bragg reflector (T-DBR) lasers. The advantages include higher power outputs, manufacturing complexity that is similar to conventional single DFB laser fabrication, wavelength stability, and the reliability and processing of DFB lasers.

When combining the outputs of a DFB laser array on-chip, additional circuits such as active-passive transitions, 1:N couplers, and integrated semiconductor optical amplifiers (SOAs) are required to compensate for the losses of the combiner. Placing the DFB lasers in a row along a single waveguide can eliminate the losses of the combiner. However, this approach introduces feedback and coupling problems in the longitudinal DFB laser array. Both combined and longitudinal DFB laser arrays also have limited scalability. The power losses in the combiner and device-to-device coupling limits the DFB laser array size to approximately 4–5 lasers and the total tunability to approximately 15 nm. This bandwidth is not sufficient enough to provide total c bandwidth coverage, which limits the DFB laser arrays to partial-band coverage.

An improved long-haul data light source preferably provides full c bandwidth coverage and has the cost, reliability and ease of manufacture of a fixed wavelength DFB laser. Cost considerations deter the use of complicated chips (such as GCSRs) or unconventional packages (such as a tunable VCSEL). In addition to chip manufacturing costs, the complexity of sophisticated control algorithms for GCSRs, VCSELs, and T-DBRs further increases the total cost of these devices.

SUMMARY OF THE INVENTION

A wavelength tunable laser according to the present invention includes a distributed feedback (DFB) laser array. The DFB laser array includes a first DFB laser diode that generates a first beam of light in a first wavelength range and a second DFB laser diode that generates a second beam of light in a second wavelength range. A microelectromechanical (MEMS) optical element adjusts to selectively couple one of the first and the second beams of light from the DFB laser array into an optical waveguide.

In other features of the present invention, the MEMS optical element includes a collimating lens and a MEMS actuator. The MEMS actuator adjusts a position of the collimating lens to select one of the first and the second beams of light. The MEMS actuator is preferably an electrostatic or a thermal actuator.

In yet other features, a focusing lens is located between the collimating lens and the optical waveguide. The optical waveguide is preferably an optical fiber suitable for telecommunications.

In still other features, the MEMS actuator includes an electrostatic comb drive structure, a flexible spring structure, and a drive circuit. The drive circuit actuates the electrostatic comb drive structure and the flexible spring structure to adjust the position of the collimating lens. Alternately, the MEMS actuator includes a thermal actuating structure and a drive circuit that powers the thermal actuating structure to adjust the position of the collimating lens.

In other features, large changes in the output wavelength are realized by activating different DFB lasers in the DFB laser array. Fine-tuning is preferably achieved by temperature tuning. The DFB laser array and the optical waveguide are mounted on a submount. A temperature of the submount is controlled by a thermoelectric cooler. The wavelength of the transmitter is adjusted by varying the current to the thermoelectric cooler.

In other features, the optical system further includes a beam splitter that reflects a first portion of one of the first and second beams of light and that passes a second portion of one of the first and second beams of light. A wavelength locker receives one of the first and second portions from the beam splitter and generates a wavelength measurement signal. A temperature tuning circuit receives the wavelength measurement signal and adjusts a temperature of the DFB laser array to vary the wavelength that is output by the DFB laser array.

In other features, a third DFB laser diode generates a third beam of light in a third wavelength range. The third wavelength range overlaps one of the first and second wavelength ranges. The third DFB laser diode is used to increase chip yield by providing redundancy.

In other features, a field lens is located between the DFB laser array and the collimating lens to remove vignetting effects. An optical isolator and a modulator are located between the beam splitter and the optical waveguide.

In still other features, the MEMS optical coupling system includes a MEMS actuator that tilts a mirror to select one of the first and second beams of light. The mirror tilts in first and second axial directions to compensate for misalignment of the collimating lens and the first and second laser diodes relative to an alignment axis.

Further features and areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein:

FIG. 1 illustrates an optical system with a distributed feedback laser array, a collimating lens that can be translated using a MEMS actuator, a focusing lens and an optical waveguide;

FIGS. 2A and 2B illustrate the collimating lens and electrostatic MEMS actuators;

FIGS. 3A and 3B illustrate the collimating lens and thermal MEMS actuators;

DETAILED DESCRIPTION OF THE PREFERRED EMBODIMENTS

Figure 2B:
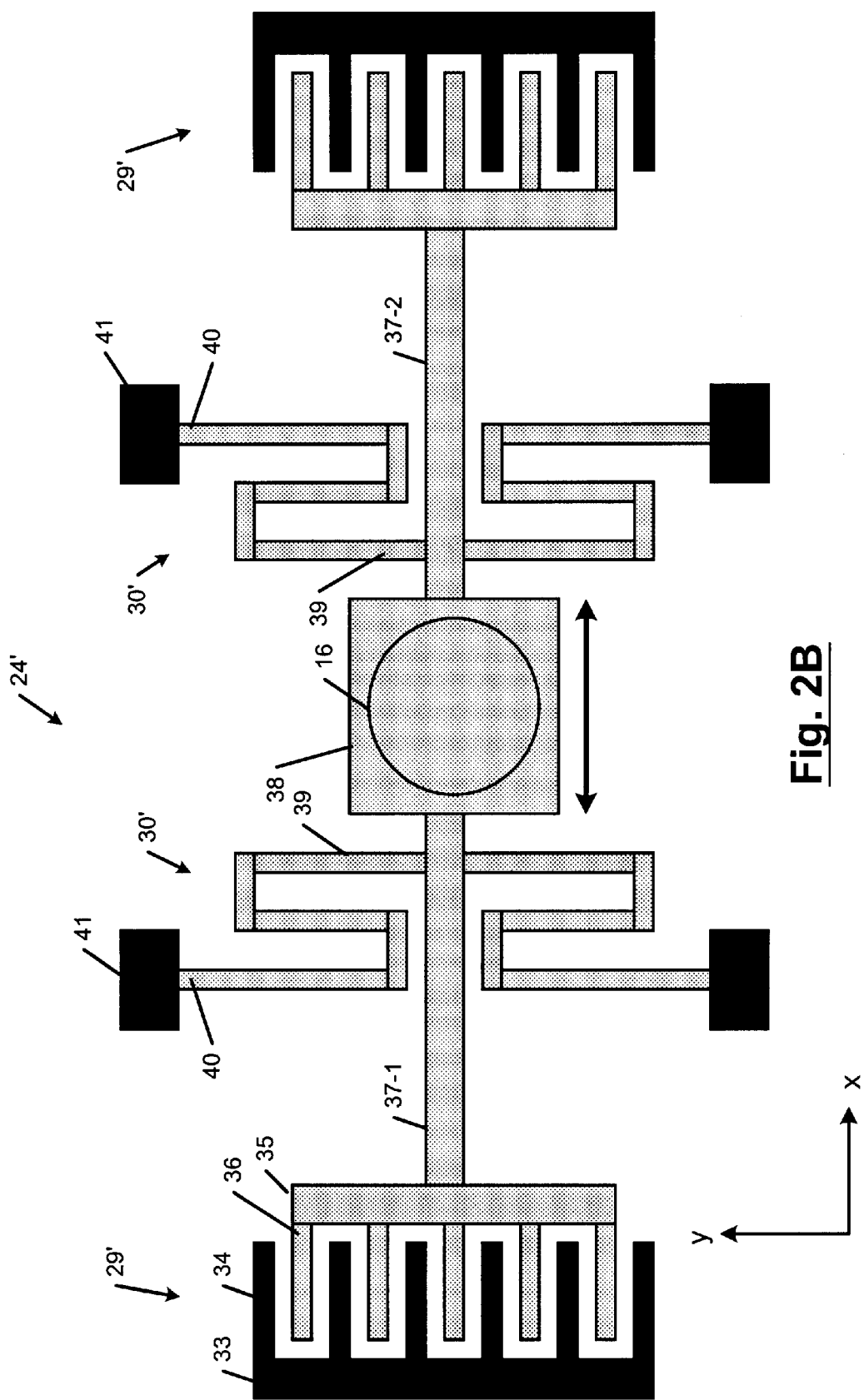

The following description of the preferred embodiment(s) is merely exemplary in nature and is in no way intended to limit the invention, its application, or uses.

Referring now to FIG. 1, an optical system 10 is shown and includes a distributed feedback (DFB) laser array 12. The DFB laser array 12 includes a plurality of DFB laser diodes 13-1, 13-2, . . . , 13-n. In a preferred embodiment, the DFB laser array 12 is temperature tunable. The temperature of the DFB laser array 12 can be adjusted by varying a drive current to a thermoelectric cooler (TEC) to tune the temperature as will be described below. Each laser diode 13 generates an optical signal 14 in a predetermined wavelength range. The optical signals 14 are directed at a collimating lens 16 that collimates the optical signals 14. A focusing lens 20 directs the collimated optical signal 14 from the DFB laser array 12 onto an input end of an optical waveguide 22. The optical waveguide 22 can be any suitable optical waveguide used for telecommunications.

The position of the collimating lens 16 is adjusted by a microelectromechanical (MEMS) actuator 24 that is connected to a drive circuit that powers the MEMS actuator 24. The MEMS actuator 24 moves the collimating lens 16 laterally (in other words, from side-to-side). For example in FIG. 1, the MEMS actuator 24 moves the collimating lens 16 along the x-axis and the optical signals 14 are generally directed along the z-axis. The collimating lens 16 and the MEMS actuator 24 allow the optical signals 14 from any laser diode 13 in the DFB laser array 12 to be coupled to the optical waveguide 22. Because the coupling is one-to-one, the coupling losses from any one laser diode 13 in the DFB laser array 12 is minimal.

Referring now to FIG. 2A, a first embodiment illustrating the structure of the collimating lens 16 and the MEMS actuator 24 is shown in further detail. The MEMS actuator 24 includes an etched structure 28 that is actuated electrostatically. The etched structure 28 permits lateral flexure or translation (along the x-axis in FIG. 2A) while limiting and/or preventing orthogonal translation in vertical or transverse directions (along the y-axis or z-axis).

Preferably, the MEMS actuator 24 and the collimating lens 16 are micromachined. The etched structure 28 preferably includes first and second electrostatic comb drive structures 29-1 and 29-2 that are located at opposite ends of the MEMS actuator 24. The etched structure 28 further includes flexible spring structures 30-1 and 30-2 that are located between the first and second electrostatic comb drive structures 29 and the collimating lens 16. The electrostatic comb drive structures 29 and the flexible spring structures 30 respond to drive signals that are output by the drive circuit 26 to translate the collimating lens 16. The flexible spring structures 30 provide restoring force to return the collimating lens to a neutral or unbiased position. The collimating lens 16 and the focusing lens 20 couple one of the optical signals 14 from one of the DFB laser diodes 13 into the optical waveguide 22.

Referring now to FIG. 2B, an alternate design for the first embodiment of the MEMS actuator 24 is shown in further detail. Solid-filled portions of FIG. 2A are fixed and dot-filled portions are moveable. The electrostatic comb drive structures 29' include a fixed portion 33 with fingers 34 and a moveable portion 35 with fingers 36. The fingers 34 are surrounded by the fingers 36. Center portions 37-1 and 37-2 connect the moveable portion 35 of the electrostatic comb drive structures 29' with the collimating lens 16 (via lens mount 38) and end portions 39 of the flexible spring structures 30'. Opposite ends 40 of the flexible spring structure 30 are connected to fixed portions 41. One or both of the electrostatic comb drive structures 29' are energized to controllably move the collimating lens 16. The flexible spring structures 30' provide a restoring force that returns the collimating lens to a neutral or unbiased position.

As can be appreciated from FIGS. 2A and 2B, the electrostatic comb drive structures 29 and 29', the flexible spring structures 30' and 30", and the other structural portions of the etched structure 28 may have many other positions, shapes and/or dimensions depending upon the specific implementation.

Referring now to FIG. 3A, a second embodiment of the collimating lens 16 and the MEMS actuator 24 is shown. The collimating lens 16 is actuated thermally and includes first and second thermal actuators 42-1 and 42-2. The MEMS actuators 42 work by mechanically amplifying the movement caused by thermal expansion when the material that forms the actuators 42 is heated. As current flows through the thermal MEMS actuators 42, the MEMS actuators 42 expand slightly and buckle. Buckling from both sides causes the collimating lens 16 to move up or down.

Examples of suitable thermal and/or electrostatic actuators are disclosed in: Erno H. Klaassen et al., "Silicon Fusion Bonding and Deep Reactive Ion Etching; a New Technology for Microstructures", Paper 139-C3 in the Conference On Transducers '95-Eurosensors (1995); Nadim I. Mauf, "An Introduction to Micro-electromechanical Systems Engineering", Artech House MEMS Library (1999); and U.S. Pat. Nos. 5,999,303, 6,044,705, 5,054,335 and 6,124,663, which are all hereby incorporated by reference.

Referring now to FIG. 3B, an alternate design for the second embodiment of the MEMS actuator 24 is shown. As in FIG. 2B, solid-filled portions are fixed and dot-filled portions are moveable. One end of thermal actuator arms 43-1, 43-2, ..., 43-n is attached to a fixed portion 44 and an opposite end is attached to a center portion 45. One end of the center portion 45 is connected to a lens mount 46. Heating the MEMS actuator 24 causes movement that is indicated by arrow 47. As can be appreciated, fabricating the actuator arms 43, the center portion 45, and the lens mount 46 at angles (that are not right angles) leads to a preferred buckling direction and mechanical amplification.

The optical system 10 according to the present invention uses DFB laser diodes 13 that are spaced closely together. For example, the DFB laser array 12 can include ten laser diodes that are spaced 10 micrometers apart such that the DFB laser array 12 is approximately 90 micrometers wide. In addition, the die size for producing the optical system 10 is approximately the size of a conventional single element DFB laser array. The manufacturing steps (including epitaxial growth) are approximately of the same complexity as the conventional single element DFB laser array.

In a preferred embodiment, the laser diodes 13 contain gratings having different pitches. The different pitches for the wavelength-selective gratings are preferably fabricated using a single exposure via a contact phase mask. The primary cost difference at the chip level is the reduced yield for the multiple diode DFB laser array 12 as compared with the yield of the conventional single element DFB laser array.

Redundancy is preferably employed to achieve yield advantage. For example, a DFB laser array 12 including $2n$ laser diodes 13 having overlapping wavelength coverage can be fabricated for an application requiring n laser diodes 13. If any of the laser diodes 13 in the DFB laser array 12 do not operate correctly, the laser diode 13 is skipped over for another laser diode 13 that operates at the same wavelength. As can be appreciated, a simple control algorithm can be employed to identify and skip over inoperative laser diodes 13. Contacts for a DFB laser array 12 with many DFB laser diodes (such as ten or greater) may require a two-level contact metalization.

The collimating lens 16 is preferably fabricated from silicon. In addition, both the collimating lens 16 and the MEMS actuator 24 are preferably formed from the same bulk silicon wafer using standard MEMS and micro-optics processing. When fabricated in this manner, the cost of the collimating lens 16 and the MEMS actuator 24 is relatively low and does not differ appreciably from the cost of a standard collimating microlens. In addition to movement in the x-axis direction, the collimating lens 16 and the MEMS actuator 24 also have an axis of actuation in a vertical or y-axis direction. To actuate in the y-axis direction, both actuators 42 are initially activated by the same amount half way in their movement range to move the lens in the x-direction. Then, the actuators 42 are unbalanced by increasing the power to actuator 42-1 and decreasing the power to actuator 42-2. This causes a translation of the collimating lens 16 towards actuator 42-2.

Figure 4:
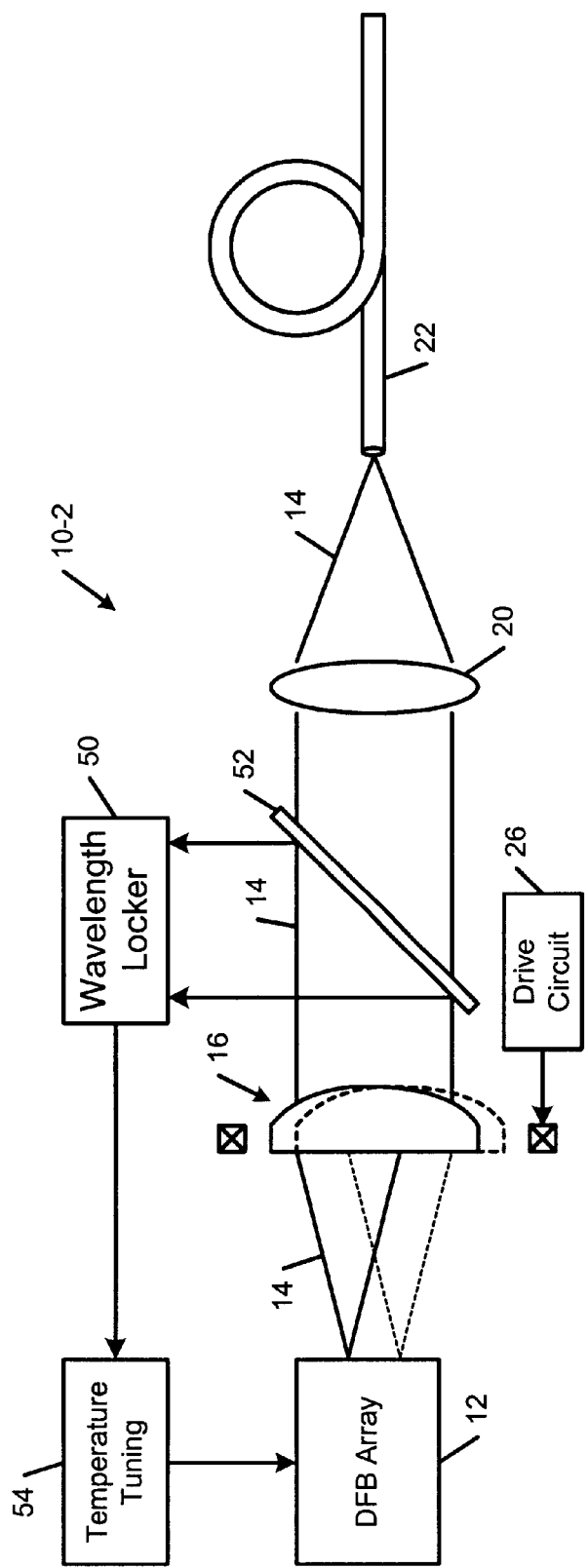
FIG. 4 illustrates the optical system of FIG. 1 with a wavelength locker.

Referring now to FIG. 4, an optical system 10-2 including a wavelength locker 50 and a beam splitter 52 is shown. For purpose of clarity, reference numbers from FIG. 1 are used in FIG. 4 where appropriate to identify similar elements. The beam splitter 52 is preferably located between the collimating lens 16 and the focusing lens 20. The beam splitter 52 reflects a portion of the optical signal 14 towards the wavelength locker 50. The wavelength error signal that is generated by the wavelength locker 50 is fed back to a temperature tuning circuit 54 that is part of (or connected to) the DFB laser array 12. The temperature tuning circuit 54 adjusts the temperature of the DFB laser array 12, for example by modifying the TEC current which in turn varies the wavelength that is output by the DFB laser array 12.

Connecting the drive circuit 26 to power the MEMs actuator is more difficult if the chip containing the collimating lens 16 and the MEMS actuator 24 includes electrostatic comb drives 29 that require a high voltage drive signal. However, the low voltage thermal actuators of FIGS. 3A and 3B can be implemented more readily. The disadvantage of thermal actuators is that they require relatively large currents and consume more electrical power than their electrostatic counterparts. Other MEMS actuators such as scratch-drives, piezoelectric actuators, and/or magnetic actuators can also be used.

Figure 5:
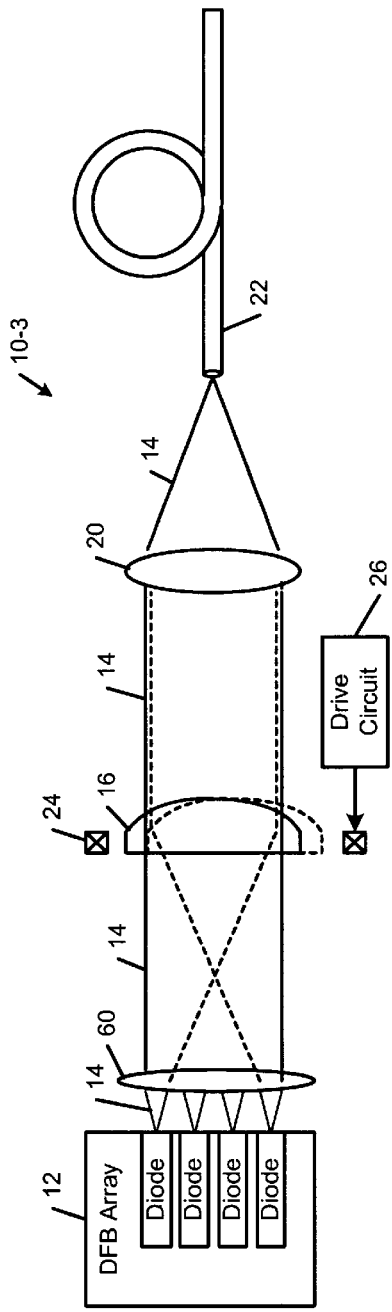
FIG. 5 illustrates the optical system of FIG. 1 with a fixed field lens.

Referring now to FIG. 5, an optical system 10-3 including a fixed field lens 60 in addition to the movable collimating lens 16 is shown. For purposes of clarity, reference numbers from FIG. 1 have been used in FIG. 5 where appropriate. The fixed field lens 60 reduces the optical loss of DFB laser diodes 13 that are located far from the optical axis. In the approach described above without a fixed field lens 60, the DFB laser diodes 13 located near outer edges of the DFB laser array 12 experience increased optical signal loss. The collimated beam that forms from each laser diode 13 is displaced slightly by an amount that is equal to the distance of the laser diode 13 from the optical axis. The losses are most significant for the DFB laser arrays 12 having an off-center position that is a substantial fraction of the width of the collimated beam that is output by the translated collimating lens 16. The losses have a vignetting effect because the focusing lens 20 cannot accept all of the input beams and efficiently couple them to the optical waveguide 22. Thus, the closer the laser diode beam is to the edge of the DFB laser array 12 (with respect to the center of the DFB laser array 12), the lower the intensity of the optical signal due to reduced optical coupling efficiency. The vignetting effect is preferably reduced or eliminated by adding the fixed field lens 60 at the output of the DFB laser array 12. A stronger fixed field lens 60 reduces the vignetting while increasing distortion. As can be appreciated, there is a trade-off between the size of the DFB laser array 12 and the power of the fixed field lens 60.

The architecture of optical systems 10 according to the present invention also allows the output to be turned off completely while tuning is accomplished. Blanking the output is realized by powering down the DFB laser array 12, moving the MEMS actuators 24, and then powering up the DFB laser array 12. Alternately, the collimating lens 16 can be intentionally misaligned when a wavelength is switched from one laser diode 13 to another via the translated collimating lens 16.

Figure 6:
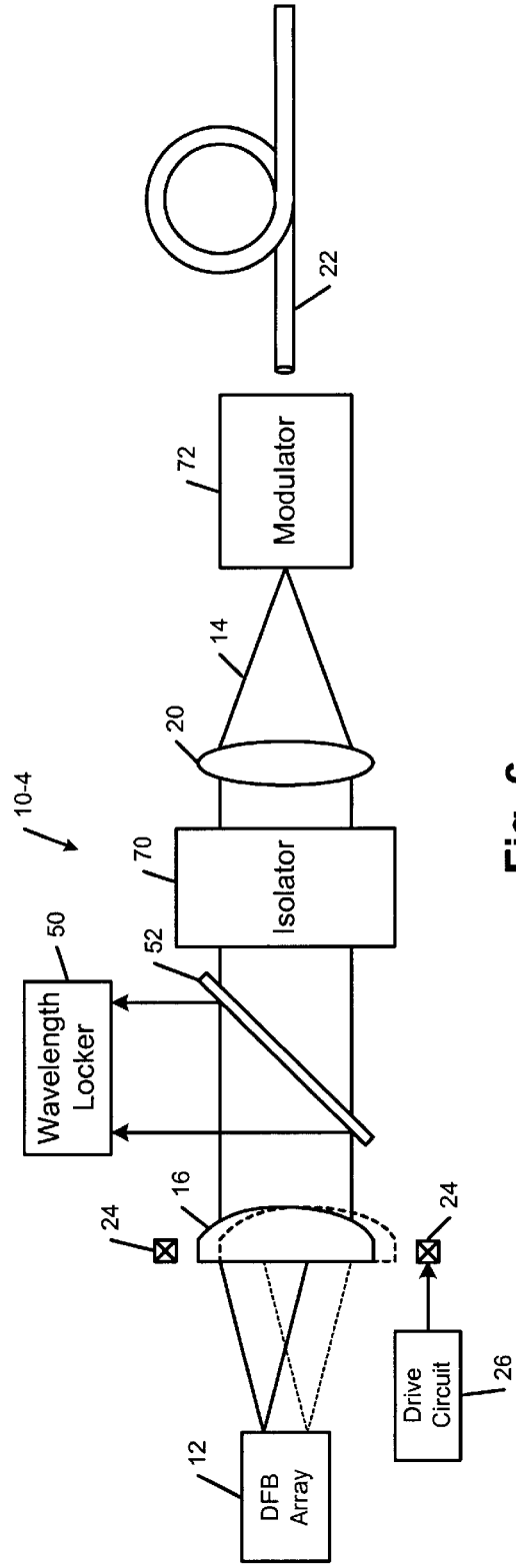
FIG. 6 illustrates the optical system of FIG. 1 with a wavelength locker, an optical isolator, and an amplitude modulator.

Referring now to FIG. 6, the DFB laser array 12, the collimating lens 16 and the MEMS actuator 24 of the optical system 10-4 are preferably mounted on a common submount. For purposes of clarity, reference numbers from FIGS. 1 and 4 have been used in FIG. 6 where appropriate. An optical isolator 70 is located between the beam splitter 52 and the focusing lens 20. A focusing lens 20 couples the light to an external amplitude modulator 72, which in turn is pigtailed to the optical waveguide 22. The optical isolator 70 and the amplitude modulator 72 can also be packaged on the same substrate as the remaining components of the optical system 10-4.

In principle, the laser diodes 13 can be modulated directly. External amplitude modulators (EAMs) can also be integrated with each laser diode 13 with drive signal distribution and control of chirp across the DFB laser array 12. Alternatively, the DFB laser array 12 includes the external amplitude modulator 72 that is shown in FIG. 6. Such external amplitude modulators can also be LiNbO or semiconductor waveguide devices.

Referring back to FIG. 2, an exemplary optical system 10 includes a DFB laser array 12 with twelve laser diodes 13 that are fabricated on a chip with 10 micron ($\mu$m) center-to-center spacing. The collimating lens 16 is laterally translatable to select the beam output of any one of the twelve laser diodes 13. With temperature tuning of the DFB laser array 12, each laser diode 13 is tuned over a 3 nm range such that the DFB laser array 12 covers a tuning range of 36 nanometers. The selected beam output from the DFB laser array 12 is collimated by the collimating lens 16 that is moved by the MEMS actuator 24. The selected beam output is directed by the focusing lens 20 into the optical waveguide 22.

Figure 7:
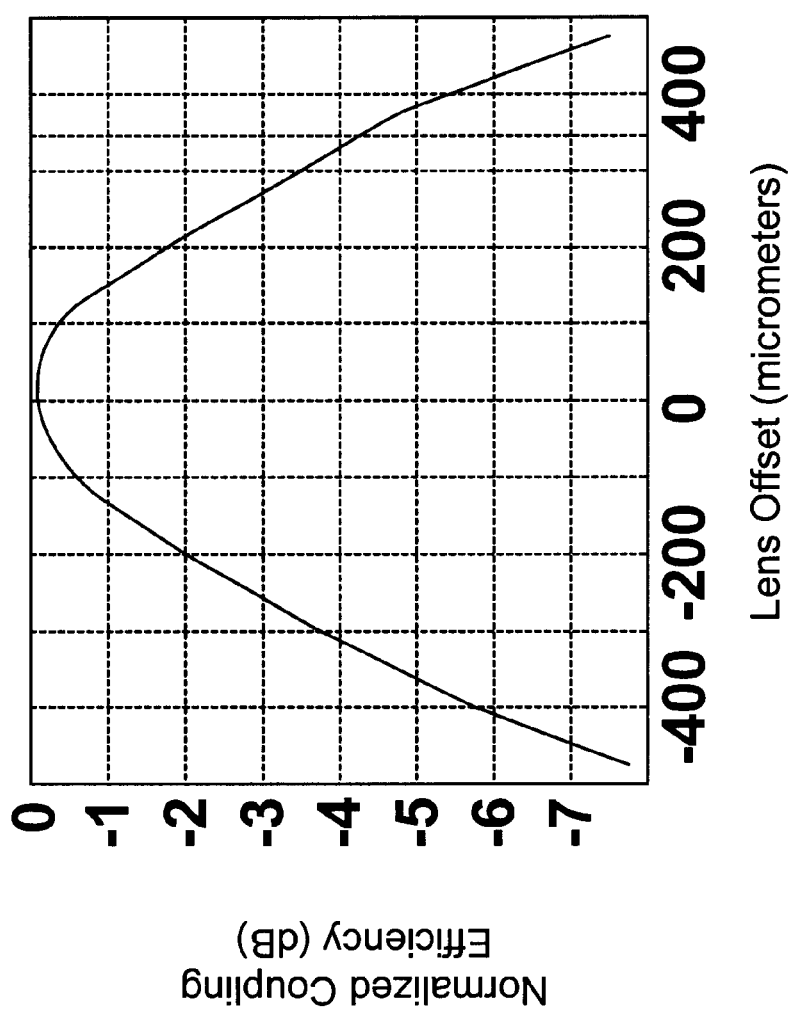
FIG. 7 is a chart illustrating coupling efficiency as a function of laser diode offset for the optical system of FIG. 1.

The exemplary optical system was used to measure the change in coupling efficiency as the collimating lens 16 is translated to select the different outputs of the DFB laser array 12. The results are shown in FIG. 7. For off-axis DFB laser diodes, the collimated beam is directed to the focusing lens 20 off the central axis. The misalignment of the beam with respect to the collimating lens 16 results in slightly reduced coupling efficiency. For a 2 mm-focal collimating and a 6 mm-focal focusing lens arrangement, the normalized coupling efficiency drops by 0.2 dB when the DFB laser diode 12 is positioned 60 micrometers ($\mu$m) off axis. An array of 12 elements spaced by 10 microns is 110 microns in size, and given that the maximum loss occurs for a device on the edge, about 55 microns from the central axis, this excess loss is only about 0.2 dB. This small loss is acceptable and efficiency can be improved with the use of the fixed field lens 60.

The attachment of a bulk microlens to the MEMS actuator 24 is less desirable because the weight of the bulk lens typically causes bowing in the MEMS actuator 24 and may hamper the motion of the collimating lens 16. In addition, attaching the bulk microlens may damage the fragile structure of the MEMS actuator 24. The collimating lens 16 is preferably formed in the MEMS silicon chip structure itself by employing a grayscale photoresist process.

The translated collimating lens 16 and the MEMS actuator 24 can be used in standard DFB packages with a linear optical train. The initial alignment process for the DFB laser array 12, the collimating lens 16, the MEMS actuator 24, the focusing lens 20 and the optical waveguide 22 is relatively straightforward. The package is also well suited for receiving the optical isolator 70.

Figure 8:
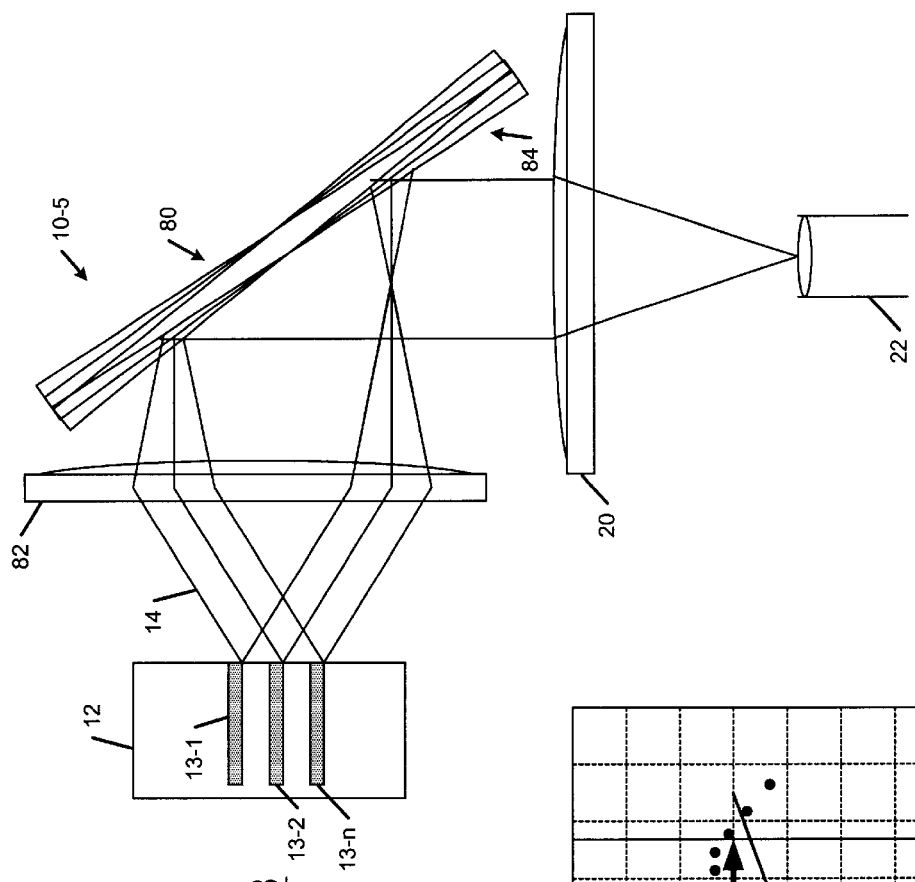
FIG. 8 illustrates an optical system including a distributed feedback array, a fixed collimating lens, a rotatable MEMS mirror, a focusing lens, and an optical waveguide.

As an alternative to a laterally translated collimating lens 16, an optical system 10-5 with a tiltable MEMS mirror 80 can also be employed as is illustrated in FIG. 8. For purposes of clarity, reference numbers from FIG. 1 have been employed in FIG. 8 to identify similar elements. The MEMS mirror 80 is preferably actuated thermally, electrostatically and/or using any other suitable MEMS structure. A reflective mirror coating 84 is formed on one surface of the MEMS mirror 80. A fixed collimating lens 82 collimates the beam outputs from the DFB laser array 12 onto the rotatable MEMS mirror 80. Rotational movement of the MEMS mirror 80 selects one beam output from the DFB laser array 12 for coupling into the optical waveguide 22 via the focusing lens 20.

For example, a DFB laser array 12 including twelve laser diodes 13 with a 3 nm range of temperature tuning provides a 36 nm tunable bandwidth. The fixed collimating lens 82 collimates all of the beams. The angle that the collimated beams exit the collimating lens 82 is determined by the location of the corresponding laser diode 13 in the DFB laser array 12 relative to the axis of the collimating lens 82. The MEMS mirror 80 has a center of rotation that is positioned at the back focal point of the collimating lens 82. The MEMS mirror 80 is rotated or tilted to select one of the beams that will be reflected to the focusing lens 20 and coupled into the optical waveguide 22.

There are several advantages to the approach that is illustrated in FIG. 8. Only fixed bulk lenses are required. The required rotation of the MEMS mirror 80 is relatively small. In the embodiment of FIG. 8, if the focal length for the first collimating lens is about 2 mm, a twelve-element DFB laser array 12 with 10 micrometer spacing requires the MEMS mirror 80 to rotate in total only 1.6° (or +/−0.8 degrees in either direction). The MEMS mirror 80 can be fabricated using standard mechanical micromachining. The MEMS mirror 80 that is fabricated from bulk silicon provides a very flat surface for receiving a mirror coating 84 of a reflective material such as gold to provide a highly reflective surface. Additional functionality can also be incorporated into the MEMS mirror 80. For example, the MEMS mirror 80 can tilt along a second axis to provide a one-time coupling optimization after assembly to reduce initial optical train assembly tolerances.

The MEMS mirror 80 is located in the focal plane of the collimating lens 82. The reflected beam output from the MEMS mirror 80 is always on-axis and centered on the focusing lens 20 thereby maintaining maximum coupling efficiency into the optical waveguide 22. In the case of the laterally translated collimating lens 16, the collimated beam is not always centered on the focusing lens 20, but shifts laterally on the collimating lens 16 depending on which laser diode 13 is activated. However, there is a similar reduction in fiber coupled power with the tilting mirror approach because the angle of the beam through the first lens varies depending on the laser diode 13 and all lenses have some off-axis aberrations. Furthermore, the distance of the DFB laser diode 13 to the mirror center increases for devices at the edges of the DFB laser array 12. Therefore, the DFB laser diode 13 is no longer at the focal point of the lens. The resulting beam is no longer perfectly collimated and has greater loss when coupled to the optical waveguide.

Figure 9:
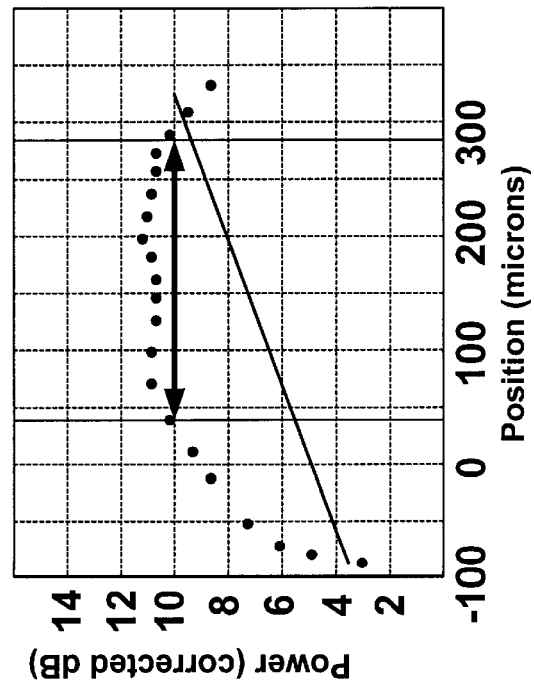
FIG. 9 illustrates the coupled power of the design in FIG. 8 as a function of laser diode position.

A bulk version of the embodiment of FIG. 8 was constructed with focal lengths of the collimating lens and the focusing lens 80 equal to 2 mm and 6 mm. In FIG. 9, the tilted mirror position verses output power is graphically illustrated. The coupling losses are negligible over the central portion. Outside of this region, the coupling losses increase due to off axis aberrations of the focusing lens and changes in the collimation. Thus, in a system made with the MEMS mirror 80, the losses are sufficiently low over a relatively large field of view.

Figure 10:
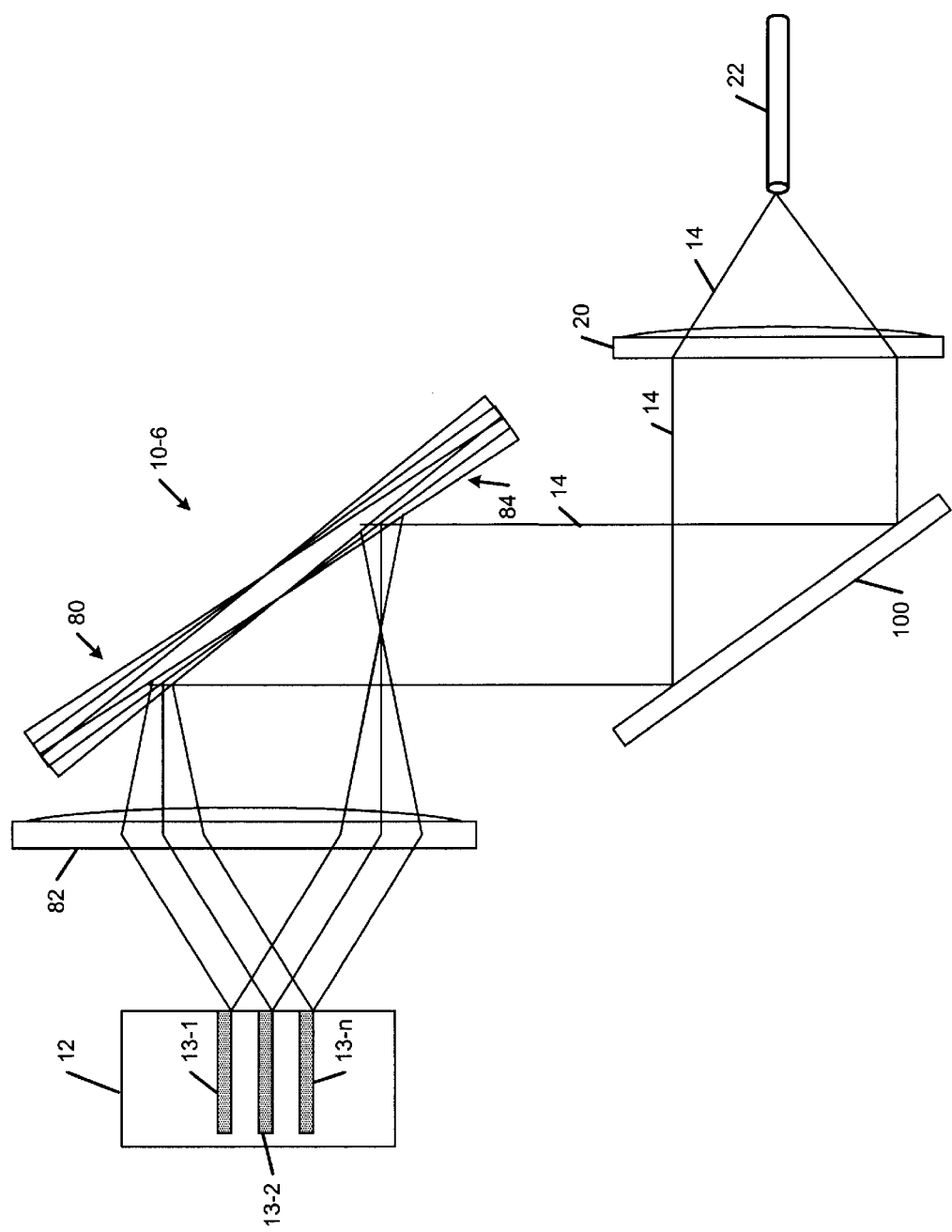
FIG. 10 illustrates a fixed bending mirror that straightens out a path of an optical system that uses a rotatable MEMs mirror.

The optical system 10-5 requires a bend in the optical path. The bend prevents mounting in a standard DFB butterfly package due to the large focal length (2 mm) of the collimating lens 16 and the focusing lens 20. Referring now to FIG. 10, an optical system 10-6 with a second mirror 100 can be inserted in the optical path to make the input and output paths parallel. As a result, a standard DFB butterfly package can be used.

The axis of rotation for the MEMS mirror 80 is preferably perpendicular to the planar surface of the DFB chip so that optimum coupling occurs for all of the laser diodes 13. If the alignment is not accurate, the outputs of the laser diodes 13 that are not in the center region of the chip will be imaged slightly above or below the input end of the optical waveguide 22 thereby reducing optical coupling efficiency. If the MEMS mirror 80 has a second axis of rotation, compensation can be performed. Chip to mirror alignment is achieved during manufacture by actively aligning the MEMS mirror 80 and chip during assembly. The output of the DFB laser array 12 is imaged while the MEMS mirror 80 is rotated to select the individual laser diode 13 output. The MEMS mirror chip is preferably aligned to allow the rotated mirror to translate the laser beam array image along the direction of the DFB laser array beam outputs.

Figure 11:
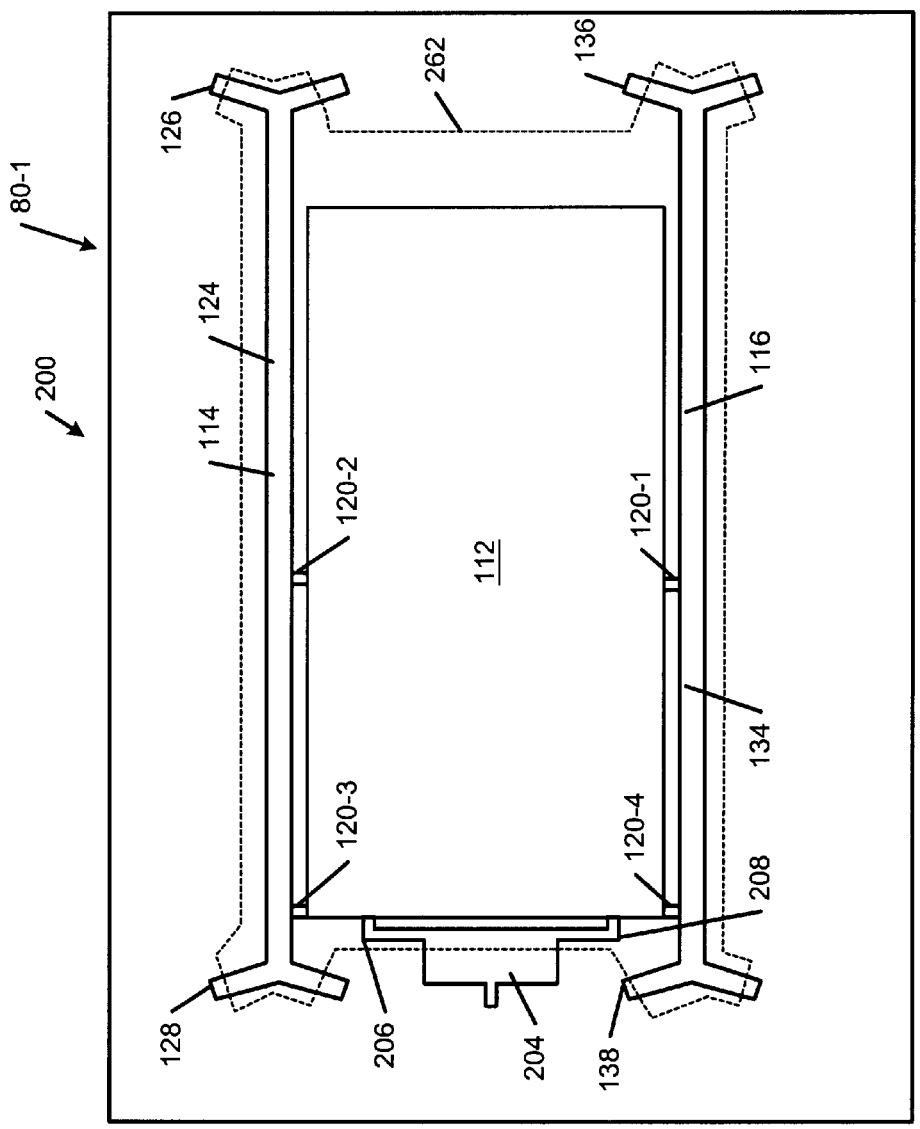
FIG. 11 is a plan view of a tiltable MEMS mirror.
Figure 12:
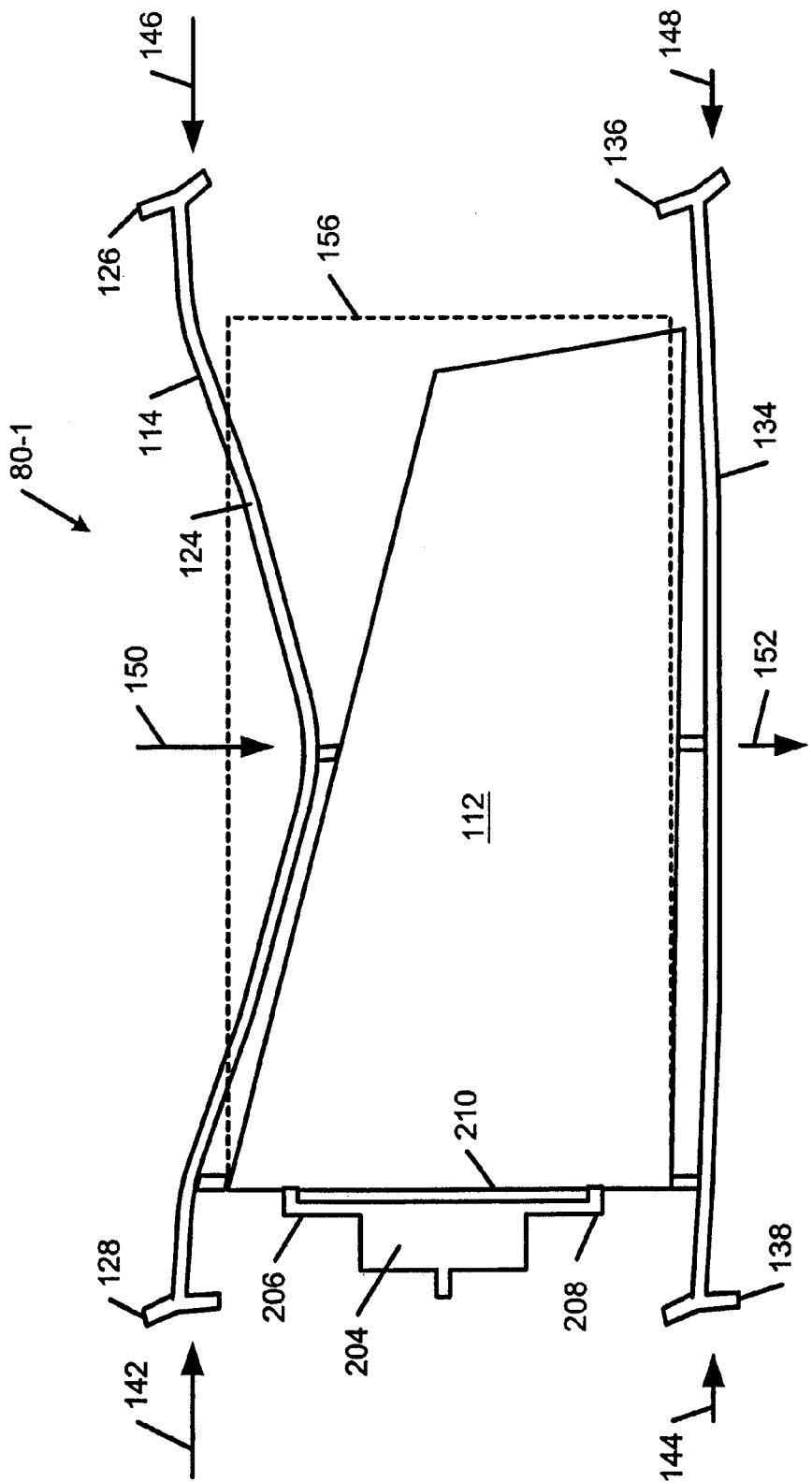
FIG. 12 is a perspective view of the tiltable MEMS mirror.

Referring now to FIGS. 11 and 12, a thermally actuated MEMS mirror 110 according to the present invention is shown. The thermally actuated MEMS mirror 110 includes a mirror 112, a first chevron 114, a second chevron 116, and four support bars 120-1, 120-2, 120-3 and 120-4. The support bars 120 connect the first and second chevrons 114 and 116 to opposite sides of the mirror 112. The moving components of the thermally actuated MEMS mirror 110 are preferably fabricated from a single planar semiconductor layer as will be described further below.

The first chevron 114 preferably includes an out-of-plane actuator 124 and first and second in-plane actuators 126 and 128 that are located at opposite ends of the out-of-plane actuator 124. Likewise, the second chevron 116 preferably includes an out-of-plane actuator 134 and first and second in-plane actuators 136 and 138 that are located at opposite ends of the out-of-plane actuator 134. One or more conventional drive circuits (not shown) are connected to the first and second chevrons 114 and 116. The drive circuits generate a controlled and regulated current that passes through the in-plane actuators 126, 128, 136, and 138. As the in-plane actuators heat and expand, they buckle in-plane and force the chevrons 116 and 124 to buckle out-of-plane. Since the center point of the first and second chevrons 114 and 116 moves up out of the plane further than the end points, the support bars 120-1 and 120-2 that are connected to the center move further than the support bars 120-3 and 120-4 that are connected to the end points. The center of the mirror is moved while the edge of the mirror is roughly in the same position and the mirror tilts. The four actuators 126, 128, 136, and 138 are preferably doped with impurity ions to provide an appropriate resistance for thermal actuation.

To tilt both sides of the mirror 80-1, the drive circuit(s) apply approximately the same amount of current to the two top actuators 126 and 128 and the bottom actuators 136 and 138. Alternately, a calibration step may be performed to determine the appropriate current level for the four actuators to obtain the desired rotation and orientation. The in-plane actuators 126,128, 136, and 138 move in a direction indicated by arrows 146, 142, 148 and 144, respectively (FIG. 12). Likewise, the out-of-plane actuators 124 and 134 move vertically out of the page in FIG. 12.

The thermally actuated MEMS mirror system according to the invention preferably employs thermal actuators for tilting the MEMS mirror. Electrostatic actuators or other suitable MEMS actuators may also be employed. Thermal actuators require relatively low voltages (typically between 1–5V) and moderate per element power (100–500 mW/mirror). Thermal actuators can provide relatively high force and when mechanically amplified, good displacement (up to 100 micrometers). Thermal actuators can be fabricated using a single step in-plane process. Thermal actuators provide a roughly linear relationship between power and mirror motion and are therefore easier to control. The thermal actuators typically have a response time between 10–100 ms.

The MEMS mirror system 200 optionally includes a hinge element 204 including first and second projecting torsion bars 206 and 208 that are connected in a spaced relationship to edge 210 of the mirror 112. When the control circuit applies substantially different current levels to the top actuators 126 and 128 and bottom in-plane actuators 136 and 138, the hinge structure helps control the mirror surface.

To fabricate the MEMS mirror 80-1, a silicon layer having a desired thickness is bonded, grown or sputtered on a silicon on insulator (SOI) wafer including silicon dioxide ($SiO_2$) and silicon (Si) layers. A bottom side or top side etch is performed to release selected portions of the MEMS mirror 80-1. For example, the portions lying within the dotted lines 262 in FIG. 11 is released while the portions outside the dotted lines 262 remain attached. After patterning, a highly reflective (HR) layer is preferably formed on an outer surface of the mirror 112.

The thermally actuated mirrors can be fabricated using surface or bulk micromachining processes. The preferred method for fabricating the thermally actuated mirrors is the bulk micromachining process due to its inherent repeatability and low built-in stress. The thermally actuated mirror can be easily fabricated using bulk micromachining with silicon wafers or bulk micromachining with silicon on insulator (SOI) wafers. In either case, the structure is formed by etching the front surface with a single masking step. A metalization step defines device contacts and can also be used to form the highly reflective (HR) layer on the mirror surface. The structure is then released by backside etching. A second etching step on the front surface or a stressed film can be used to break the symmetry and cause buckling in an upward direction in the out-of plane elements 114 and 116.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. A wavelength tunable laser comprising:
   a distributed feedback (DFB) laser array including a first DFB laser diode that generates a first beam of light in a first wavelength range and a second DFB laser diode that generates a second beam of light in a second wavelength range;
   an optical waveguide; and
   a microelectromechanical (MEMS) optical element adjustable to selectively couple one of said first and second beams of light from said DFB laser array into said optical waveguide.

2. The wavelength tunable laser of claim 1 wherein said MEMS optical element includes:
   a collimating lens; and
   a MEMS actuator that adjusts a position of said collimating lens to select said one of said first and second beams of light.

3. The wavelength tunable laser of claim 2 wherein said MEMS actuator moves in one plane.

4. The wavelength tunable laser of claim 2 wherein said MEMS actuator includes an electrostatic actuator.

5. The wavelength tunable laser of claim 2 wherein said MEMS actuator includes a thermal actuator.

6. The wavelength tunable laser of claim 2 further comprising a focusing lens that is optically positioned between said collimating lens and said optical waveguide.

7. The wavelength tunable laser of claim 1 wherein said optical waveguide includes optical fiber suitable for telecommunications.

8. The wavelength tunable laser of claim 2 wherein said collimating lens and said MEMS actuator are fabricated using bulk silicon.

9. The wavelength tunable laser of claim 4 further comprising:
an electrostatic comb drive structure;
a flexible spring structure; and
a drive circuit that actuates said electrostatic comb drive structure and said flexible spring structure to adjust said position of said collimating lens.

10. The wavelength tunable laser of claim 5 further comprising:
a thermal actuating structure; and
a drive circuit that provides power to said thermal actuating structure to adjust said position of said collimating lens.

11. The wavelength tunable laser of claim 1 wherein said DFB laser array is temperature tunable.

12. The wavelength tunable laser of claim 11 further comprising:
a beam splitter that reflects a first portion of said one of said first and second beams of light and that passes a second portion of said one of said first and second beams of light;
a wavelength locker that receives one of said first and second portions from said beam splitter and that generates a wavelength error signal; and
a thermoelectric cooler that adjusts a temperature of said DFB laser array to vary a wavelength output by said DFB laser array based on said wavelength error signal.

13. The wavelength tunable laser of claim 1 further comprising a third DFB laser diode that generates a third beam of light in a third wavelength range, wherein said third wavelength range overlaps at least one of said first and second wavelength ranges.

14. The wavelength tunable laser of claim 1 further comprising a field lens that is located between said DFB laser array and said MEMS optical element, wherein said field lens removes vignetting effects.

15. The wavelength tunable laser of claim 2 wherein said first and second laser diodes, said collimating lens and said MEMS actuator are packaged on a common substrate.

16. The wavelength tunable laser of claim 1 wherein said first and second wavelength ranges are adjacent wavelength ranges.

17. The wavelength tunable laser of claim 1 further comprising an optical isolator that is located between said MEMS optical element and said optical waveguide.

18. The wavelength tunable laser of claim 1 further comprising an amplitude modulator that is located between said MEMS optical element and said optical waveguide.

19. The wavelength tunable laser of claim 1 wherein said MEMS optical element comprises:
a mirror; and
a MEMS actuator for tilting said mirror to select said one of said first and second beams of light.

20. The wavelength tunable laser of claim 19 wherein said MEMS actuator includes thermal actuators for tilting said movable mirror.

21. The wavelength tunable laser of claim 19 wherein said MEMS actuator includes electrostatic actuators for tilting said movable mirror.

22. The wavelength tunable laser of claim 19 further comprising:
a collimating lens that collimates said first and second beams of light; and
a focusing lens that focuses said one of said first and second beams of light reflected by said mirror into said optical waveguide.

23. The wavelength tunable laser of claim 22 further comprising a second mirror that is optically located between said mirror and said focusing lens.

24. The wavelength tunable laser of claim 22 wherein said mirror tilts in first and second axial directions to compensate for misalignment of said collimating lens and said first and second laser diodes relative to an alignment axis.

25. The wavelength tunable laser of claim 22 further comprising an optical isolator that is located between said focusing lens and said mirror.

26. The wavelength tunable laser of claim 22 further comprising an amplitude modulator that is located between said focusing lens and said optical waveguide.

27. A method for providing a beam of laser light having a tunable wavelength, comprising the steps of:
packaging a first DFB laser diode that generates a first beam of light in a first wavelength range and a second DFB laser diode that generates a second beam of light in a second wavelength range in a distributed feedback (DFB) array;
positioning a microelectromechanical (MEMS) optical element between said DFB laser array and an optical waveguide; and
selectively coupling one of said first and second beams of light from said DFB laser array into said optical waveguide.

28. The method of claim 27 further comprising the step of collimating said first and second beams of light.

29. The method of claim 28 further comprising the step of adjusting a position of said collimating lens with a MEMS actuator to select said one of said first and second beams of light.

30. The method of claim 29 wherein said MEMS actuator moves in one plane.

31. The method of claim 29 wherein said MEMS actuator is an electrostatic actuator.

32. The method of claim 29 wherein said MEMS actuator is a thermal actuator.

33. The method of claim 27 further comprising the step of positioning a focusing lens between said DFB laser array and said optical waveguide.

34. The method of claim 27 wherein said optical waveguide includes optical fiber.

35. The method of claim 29 further comprising the step of fabricating said collimating lens and said MEMS actuator from bulk silicon.

36. The method of claim 31 further comprising the step of actuating an electrostatic comb drive structure and a flexible spring structure to adjust said position of said collimating lens.

37. The method of claim 32 further comprising the step of actuating a thermal comb drive structure to adjust said position of said collimating lens.

38. The method of claim 27 further comprising the step of tuning a wavelength output by said DFB laser array by varying a temperature of said DFB laser array.

39. The method of claim 38 further comprising the steps of:
splitting said one of said first and second beams of light from said MEMS optical element into a first portion that is reflected by a beam splitter and a second portion that is passed by said beam splitter;

generating a wavelength error signal from one of said first and second portions; and temperature tuning said DFB laser array based on said wavelength error signal.

40. The method of claim 27 further comprising the step of packaging a third DFB laser diode in said DFB laser array that generates a third beam of light in a third wavelength range, wherein said third wavelength range overlaps at least one of said first and second wavelength ranges.

41. The method of claim 27 further comprising the step of removing vignetting effects by positioning a field lens between said DFB laser array and said MEMS optical element.

42. The method of claim 29 further comprising the step of packaging said first and second laser diodes, said collimating lens and said MEMS actuator on a common substrate.

43. The method of claim 27 wherein said first and second wavelength ranges are adjacent wavelength ranges.

44. The method of claim 27 further comprising the steps of providing a optical isolator between said DFB laser array and said optical waveguide.

45. The method of claim 27 further comprising the step of providing an amplitude modulator between said DFB laser array and said optical waveguide.

46. The method of claim 27 further comprising the step of tilting a mirror using a MEMS actuator to select one of said first and second beams of light.

47. The method of claim 46 further comprising the step of tilting said mirror using an electrostatic actuator.

48. The method of claim 46 further comprising the step of tilting said mirror using a thermal actuator.

49. The method of claim 46 further comprising the step of optically positioning a second mirror between said mirror and said optical waveguide.

50. The method of claim 46 further comprising the step of tilting said mirror in first and second axial directions to compensate for misalignment.

51. The method of claim 46 further comprising the step of positioning an optical isolator between said mirror and said optical waveguide.

52. A wavelength tunable laser comprising:

a distributed feedback (DFB) array including a first DFB laser diode that generates a first beam of light in a first wavelength range and a second DFB laser diode that generates a second beam of light in a second wavelength range;

an optical waveguide;

a collimating lens; and a MEMS actuator for adjusting a position of said collimating lens to selectively couple one of said first and second beams of light from said DFB laser array into said optical waveguide.

53. The wavelength tunable laser of claim 52 wherein said MEMS actuator moves in one plane.

54. The wavelength tunable laser of claim 52 wherein said MEMS actuator includes an electrostatic actuator.

55. The wavelength tunable laser of claim 52 wherein said MEMS actuator includes a thermal actuator.

56. The wavelength tunable laser of claim 52 further comprising a focusing lens that is located between said collimating lens and said optical waveguide.

57. The wavelength tunable laser of claim 52 wherein said optical waveguide includes optical fiber suitable for telecommunications.

58. The wavelength tunable laser of claim 54 wherein said MEMS actuator further comprises:

an electrostatic comb drive structure; and a flexible spring structure.

59. The wavelength tunable laser of claim 55 wherein said MEMS actuator further comprises a thermal comb drive structure.

60. The wavelength tunable laser of claim 52 wherein said DFB laser array is temperature tunable.

61. The wavelength tunable laser of claim 60 further comprising:

a beam splitter that reflects a first portion of said one of said first and second beams of light and that passes a second portion of said one of said first and second beams of light;

a wavelength locker that receives one of said first and second portions from said beam splitter and that generates a wavelength error signal; and a thermoelectric cooler that adjusts a temperature of said DFB laser array to vary a wavelength output by said DFB laser array based on said wavelength error signal.

62. The wavelength tunable laser of claim 52 further comprising a third DFB laser diode that generates a third beam of light in a third wavelength range, wherein said third wavelength range overlaps one of said first and second wavelength ranges.

63. The wavelength tunable laser of claim 52 further comprising a field lens that is located between said DFB laser array and said collimating lens, wherein said field lens removes vignetting effects.

64. The wavelength tunable laser of claim 52 wherein said first and second wavelength ranges are adjacent wavelength ranges.

65. The wavelength tunable laser of claim 52 further comprising a optical isolator that is located between said DFB laser array and said optical waveguide.

66. The wavelength tunable laser of claim 52 further comprising an amplitude modulator that is located between said DFB laser array and said optical waveguide.

67. A method for providing a beam of laser light having a tunable wavelength, comprising the steps of:

providing a distributed feedback (DFB) array;

generating a first beam of light in a first wavelength range using a first DFB laser diode of said DFB laser array;

generating a second beam of light in a second wavelength range using a second DFB laser diode of said DFB laser array;

positioning a collimating lens adjacent to said DFB laser array; and selectively coupling one of said first and second beams of light from said DFB laser array into said optical waveguide using a MEMS actuator that adjusts a position of said collimating lens.

68. The method of claim 67 wherein said MEMS actuator includes an electrostatic actuator.

69. The method of claim 67 wherein said MEMS actuator includes a thermal actuator.

70. The method of claim 67 further comprising the step of positioning a focusing lens between said collimating lens and said optical waveguide.

71. The method of claim 67 wherein said optical waveguide is optical fiber suitable for telecommunications.

72. The method of claim 68 further comprising the step of actuating an electrostatic comb drive structure and a flexible spring structure to adjust said position of said collimating lens.

73. The method of claim 69 further comprising the step of actuating a thermal comb drive structure to adjust said position of said collimating lens.

74. The method of claim 67 further comprising the step of tuning a wavelength of said DFB laser array by varying a temperature of said DFB laser array.

75. The method of claim 74 further comprising the steps of:
reflecting a first portion of said one of said first and second beams of light using a beam splitter;
passing a second portion of said one of said first and second beams of light using said beam splitter;
generating a wavelength error signal from one of said first and second portions; and
adjusting a temperature of said DFB laser array using said wavelength error signal to vary said wavelength output by said DFB laser array.

76. The method of claim 67 further comprising the step of packaging a third DFB laser diode that generates a third beam of light in a third wavelength range in said DFB laser array, wherein said third wavelength range overlaps one of said first and second wavelength ranges.

77. The method of claim 67 further comprising the step of removing vignetting effects using a field lens that is located between said DFB laser array and said collimating lens.

78. The method of claim 67 wherein said first and second wavelength ranges are adjacent wavelength ranges.

79. The method of claim 67 further comprising the step of locating a optical isolator between said DFB laser array and said optical waveguide.

80. The method of claim 70 further comprising the step of locating an amplitude modulator between said focusing lens and said optical waveguide.

81. A wavelength tunable laser comprising:
a distributed feedback (DFB) array including a first DFB laser diode that generates a first beam of light in a first wavelength range and a second DFB laser diode that generates a second beam of light in a second wavelength range;
an optical waveguide;
a collimating lens that collimates said first and second beams of light;
a mirror; and
a MEMS actuator for tilting said mirror to selectively couple one of said first and second beams of light from said DFB laser array into said optical waveguide.

82. The wavelength tunable laser of claim 81 wherein said MEMS actuator includes thermal actuators for tilting said mirror.

83. The wavelength tunable laser of claim 81 wherein said MEMS actuator includes electrostatic actuators for tilting said mirror.

84. The wavelength tunable laser of claim 81 further comprising a focusing lens that is located between said mirror and said optical waveguide and that focuses said one of said first and second beams of light reflected by said mirror into said optical waveguide.

85. The wavelength tunable laser of claim 84 further comprising a second mirror that is optically located between said mirror and said focusing lens.

86. The wavelength tunable laser of claim 81 wherein said mirror tilts in first and second axial directions to compensate for misalignment.

87. The wavelength tunable laser of claim 81 further comprising an optical isolator that is located between said DFB laser array and said mirror.

88. A method for providing a beam of laser light having a tunable wavelength, comprising the steps of:
providing a distributed feedback (DFB) array;
generating a first beam of light in a first wavelength range using a first DFB laser diode of said DFB laser array;
generating a second beam of light in a second wavelength range using a second DFB laser diode of said DFB laser array;
collimating at least one of said first and second beams of light; and
tilting mirror using a MEMS actuator to selectively couple one of said first and second beams of light from said DFB laser array into an optical waveguide.

89. The method of claim 88 wherein said MEMS actuator includes thermal actuators for tilting said mirror.

90. The method of claim 88 wherein said MEMS actuator includes electrostatic actuators for tilting said mirror.

91. The method of claim 88 further comprising the step of focusing said one of said first and second beams of light reflected by said mirror into said optical waveguide.

92. The method of claim 91 further comprising the step of optically positioning a second mirror between said mirror and said optical waveguide.

93. The method of claim 88 wherein said mirror tilts in first and second axial directions to compensate for misalignment.

94. The method of claim 88 further comprising the step of locating an optical isolator between said DFB laser array and said mirror.

95. A telecommunications laser package adapted to couple an optical signal having a predetermined wavelength selected from a plurality of predetermined wavelengths into an optical waveguide comprising:
a plurality of DFB lasers formed in an array, at least two of the DFB lasers generating an optical signal having substantially different wavelengths; and
a collimating lens mounted in a microelectromechanical structure (MEMS) moveable to couple light emitted from any one of the DFB lasers along a path calculated to enter the optical waveguide.

96. The telecommunications package of claim 95 wherein at any given time the collimating lens couples light emitted from only one of the DFB lasers along a path calculated to enter the optical waveguide.

97. The telecommunications package of claim 96 wherein the optical waveguide is an optical fiber.

98. A telecommunications laser package adapted to couple an optical signal having a predetermined wavelength selected from a plurality of predetermined wavelengths into an optical waveguide comprising:
a plurality of DEB lasers formed in an array, at least two of the DFB lasers generating an optical signal having substantially different wavelengths; and
a microelectromechanical structure (MEMS) mirror moveable to reflect light emitted from any one of the DFB lasers along a path calculated to enter the optical waveguide.

99. The telecommunications package of claim 98 wherein the MEMS mirror reflects light emitted from only one of the DFB lasers along a path calculated to enter the optical waveguide.

100. The telecommunications package of claim 99 wherein the optical waveguide is an optical fiber.

101. A telecommunication network including a tunable laser system, the tunable laser system providing an optical signal transmitting information over a fiber optic line, the optical signal being of a wavelength selected from a plurality of predetermined wavelengths, the tunable laser comprising:

an array of distributed feedback (DFB) lasers, each of the DFB lasers emitting light in a predetermined wavelength range, at least some of the DFB lasers emitting light in different wavelength ranges, a collimating lens, and a MEMS actuator coupled to the collimating lens so as to position the collimating lens to couple light from any one of the DFB lasers on a path expected to result in transmission of the light on the fiber optic line.

102. A telecommunication network including a tunable laser system, the tunable laser system providing an optical signal transmitting information over a fiber optic line, the optical signal being of a wavelength selected from a plurality of predetermined wavelengths, the tunable laser comprising:

an array of distributed feedback (DFB) lasers, each of the DFB lasers emitting light in a predetermined wavelength range, at least some of the DFB lasers emitting light in different wavelength ranges, a MEMS mirror moveable so as to couple light from any one of the DEB lasers on a path expected to result in transmission of the light on the fiber optic line.

* * * * *

UNITED STATES PATENT AND TRADEMARK OFFICE
CERTIFICATE OF CORRECTION

PATENT NO. : 6,754,243 B2
DATED : June 22, 2004
INVENTOR(S) : Missey et al.

It is certified that error appears in the above-identified patent and that said Letters Patent is hereby corrected as shown below:

Title page,
Item [60], Related U.S. Application Data, "No. 60/224,385" should read -- No. 60/224,384 --

Column 16,
Line 52, "of DEB lasers" should read -- of DFB lasers --

Column 18,
Line 9, "of the DEB lasers" should read -- of the DFB lasers --

Signed and Sealed this

Twenty-second Day of March, 2005

JON W. DUDAS
*Director of the United States Patent and Trademark Office*